(12) United States Patent
Lu et al.

(10) Patent No.: US 9,443,952 B2
(45) Date of Patent: Sep. 13, 2016

(54) METHOD OF FORMING SEMICONDUCTOR DEVICE

(71) Applicant: United Microelectronics Corp., Hsinchu (TW)

(72) Inventors: Chun-Tsen Lu, Tainan (TW); Chih-Jung Su, Tainan (TW); Jian-Wei Chen, Kaohsiung (TW); Shui-Yen Lu, Tainan (TW); Yi-Wen Chen, Tainan (TW); Po-Cheng Huang, Kaohsiung (TW); Chen-Ming Huang, Taipei (TW); Shih-Fang Tzou, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 188 days.

(21) Appl. No.: 14/506,009

(22) Filed: Oct. 3, 2014

(65) Prior Publication Data

US 2016/0099179 A1 Apr. 7, 2016

(51) Int. Cl.
| | | |
|---|---|---|
| H01L 21/3205 | (2006.01) | |
| H01L 29/66 | (2006.01) | |
| H01L 21/8234 | (2006.01) | |
| H01L 21/3105 | (2006.01) | |
| H01L 21/311 | (2006.01) | |
| H01L 21/02 | (2006.01) | |
| H01L 21/8238 | (2006.01) | |
| H01L 29/49 | (2006.01) | |
| H01L 29/51 | (2006.01) | |

(52) U.S. Cl.
CPC ..... *H01L 29/66545* (2013.01); *H01L 21/0206* (2013.01); *H01L 21/02271* (2013.01); *H01L 21/311* (2013.01); *H01L 21/31055* (2013.01); *H01L 21/31144* (2013.01); *H01L 21/823431* (2013.01); *H01L 21/823821* (2013.01); *H01L 29/4966* (2013.01); *H01L 29/517* (2013.01)

(58) Field of Classification Search
USPC .......................................................... 438/585
See application file for complete search history.

*Primary Examiner* — Telly Green
(74) *Attorney, Agent, or Firm* — J.C. Patents

(57) ABSTRACT

A method of forming a semiconductor device is disclosed. A substrate having multiple fins is provided. An insulating layer fills a lower portion of a gap between two adjacent fins. At least one first stacked structure is formed on one fin and at least one second stacked structure is formed on one insulation layer. A first dielectric layer is formed to cover the first and second stacked structures. A portion of the first dielectric layer and portions of the first and second stacked structures are removed. Another portion of the first dielectric layer is removed until a top of the remaining first dielectric layer is lower than tops of the first and second stacked structures. A second dielectric layer is formed to cover the first and second stacked structures. A portion of the second dielectric layer is removed until the tops of the first and second stacked structures are exposed.

20 Claims, 3 Drawing Sheets

METHOD OF FORMING SEMICONDUCTOR DEVICE

FIELD OF THE PRESENT INVENTION

The present invention relates to an integrated circuit (IC) fabrication, and particularly to a method of forming a semiconductor device.

DESCRIPTION OF RELATED ART

MOS is a basic structure widely applied to various semiconductor devices, such as memory devices, image sensors and display devices. An electric device is required to be made lighter, thinner and smaller. As the CMOS is continuously minimized, a logic CMOS technology is developed towards a technology having a high-k dielectric layer and a metal gate.

The metal gate is usually formed by the following steps. First, a dummy gate is formed on a substrate, and then a dielectric layer is formed on the substrate outside of the dummy gate. Thereafter, the dummy gate is removed to form a gate trench, and then a metal gate is formed in the gate trench. However, during the step of removing the dummy gate, oxide loss (or called dishing) and polymer residues are usually observed on the surface of the dielectric layer. In such case, metal residues remain in the dishing and undesired masking defects caused from the polymer residues are generated. Therefore, the performance of the device is decreased.

SUMMARY OF THE PRESENT INVENTION

Accordingly, the present invention provides a method of forming a semiconductor structure, by which the conventional oxide loss and polymer residues are not observed so that the performance of the device can be effectively improved.

The invention provides a method of forming a semiconductor device. A substrate having multiple fins is provided, wherein an insulating layer is formed to fill a lower portion of a gap between two adjacent fins. At least one first stacked structure and at least one second stacked structure are formed on the substrate, wherein the first stacked structure is disposed on one fin and the second stacked structure is disposed on one insulation layer. A first dielectric layer is formed on the substrate covering the first and second stacked structures. A portion of the first dielectric layer and portions of the first and second stacked structures are removed. Another portion of the first dielectric layer is removed until a top surface of the remaining first dielectric layer is lower than top surfaces of the first and second stacked structures. A second dielectric layer is formed on the substrate covering the first and second stacked structures. A portion of the second dielectric layer is removed until the top surfaces of the first and second stacked structures are exposed.

According to an embodiment of the present invention, the step of removing the portion of the first dielectric layer and the portions of the first and second stacked structures includes performing a chemical mechanical polishing (CMP) process.

According to an embodiment of the present invention, the step of removing the another portion of the first dielectric layer includes performing an etching back process.

According to an embodiment of the present invention, the step of removing the portion of the second dielectric layer includes performing a chemical mechanical polishing (CMP) process.

According to an embodiment of the present invention, the first stacked structure includes, from bottom to top, a first interfacial layer, a first gate layer and a first composite mask layer, and the second stacked structure includes, from bottom to top, a second interfacial layer, a second gate layer and a second composite mask layer.

According to an embodiment of the present invention, a top surface of the first composite mask layer is lower than a top surface of the second composite mask layer.

According to an embodiment of the present invention, the first composite mask layer includes a first lower mask layer and a first upper mask layer, and the second composite mask layer includes a second lower mask layer and a second upper mask layer.

According to an embodiment of the present invention, the first and second upper mask layers are removed during the step of removing the portions of the first and second stacked structures.

According to an embodiment of the present invention, each of the first lower mask layer and the second lower mask layer includes silicon nitride, and each of the first upper mask layer and the second upper mask layer includes silicon oxide.

According to an embodiment of the present invention, the method further includes forming a contact etch stop layer (CESL) after the step of forming the first and second stacked structures and before the step of forming the first dielectric layer.

According to an embodiment of the present invention, the method further includes performing a first cleaning step after the step of removing the portion of the first dielectric layer and the portions of the first and second stacked structures and before the step of removing the another portion of the first dielectric layer.

According to an embodiment of the present invention, a first cleaning agent used in the first cleaning step includes a sulfuric acid-hydrogen peroxide mixture (SPM) and an ammonium hydrogen peroxide mixture (APM).

According to an embodiment of the present invention, the method further includes performing a second cleaning step after the step of removing the another portion of the first dielectric layer and before the step of forming the second dielectric layer.

According to an embodiment of the present invention, a second cleaning agent used in the second cleaning step includes a sulfuric acid-hydrogen peroxide mixture (SPM) and an ammonium hydrogen peroxide mixture (APM).

According to an embodiment of the present invention, the method further includes performing a third cleaning step after the step of removing the portion of the second dielectric layer.

According to an embodiment of the present invention, a third cleaning agent used in the third cleaning step includes a sulfuric acid-hydrogen peroxide mixture (SPM) and an ammonium hydrogen peroxide mixture (APM).

According to an embodiment of the present invention, the second dielectric layer is denser and harder than the first dielectric layer.

According to an embodiment of the present invention, the step of forming the first dielectric layer includes performing a flowable CVD (FCVD) process.

According to an embodiment of the present invention, the step of forming the second dielectric layer includes performing a high density plasma CVD (HDP-CVD) process.

According to an embodiment of the present invention, the method further includes removing the first and second stacked structures to form gate trenches in the first and second dielectric layers.

In view of the above, the present invention provides a method of forming a semiconductor structure, by which an interlayer dielectric (ILD) layer between stacked structures is provided with a dual-layer configuration, and the upper dielectric layer is harder and denser than the lower dielectric layer. Accordingly, oxide loss or formation of dishing can be avoided during the step of removing dummy gates, and thereby the conventional issue of metal residues in the dishing can be settled. Besides, multiple cleaning steps are performed at appropriate stages, so as to effectively remove polymer residues and therefore improve the performance of the device.

Several exemplary embodiments accompanied with figures are described in detail below to further describe the present invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
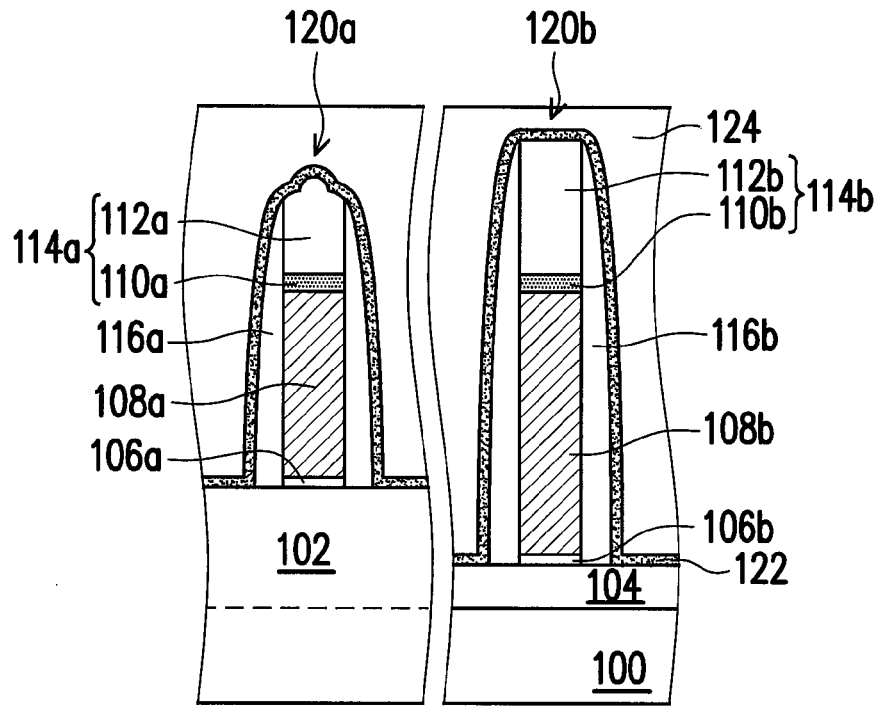
FIG. 1A to FIG. 1F are schematic cross-sectional views illustrating a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic cross-sectional views illustrating a method of forming a semiconductor device according to an embodiment of the present invention. In this embodiment, the method of the invention is integrated with a metal gate process for illustration.

Referring to FIG. 1A, a semiconductor substrate 100 is provided. The semiconductor substrate 100 can be a silicon-containing substrate with multiple fins 102 extending in a first direction. Thereafter, an insulating layer (or called a shallow trench isolation structure) 104 is formed to fill the lower portion of a gap between two adjacent fins 102. The insulating layers 104 include silicon oxide. The method of forming the insulating layers 104 includes depositing an insulating material layer (not shown) on the substrate 100 covering the fins 102, and then performing an etching back process until the upper portions of the fins 102 are exposed. For clarity and convenience of illustration, only one fin 102 and only one insulating layer 104 are shown in FIG. 1A, but the present invention is not limited thereto.

Thereafter, at least one first stacked structure 120a and at least one second stacked structure 120b are formed on the substrate 100. The first and second gate structures 120a and 120b cross the fins 102 and extend in a second direction different from the first direction. For example, the second direction is perpendicular to the first direction. In an embodiment, the first stacked structure 120a is disposed on one fin 102 and the second stacked structure 120b is disposed on one insulation layer 104. In an embodiment, the first stacked structure 120a is disposed in a logic area or in a static random access memory (SRAM) area, and the second stacked structure 120b is disposed in a bump area. The first and second gate structures 120a and 120b are formed by depositing a stack of layers and patterning the stack of layers with photolithography and etching steps.

In an embodiment, the first stacked structure 120a includes, from bottom to top, a first interfacial layer 106a, a first gate layer 108a and a first lower mask layer 110a and a first upper mask layer 112a. The first lower mask layer 110a and the first upper mask layer 112a constitute a first composite mask layer 114a. Similarly, the second stacked structure 120b includes, from bottom to top, a second interfacial layer 106b, a second gate layer 108b and a second lower mask layer 110b and a second upper mask layer 112b. The second lower mask layer 110b and the second upper mask layer 112b constitute a second composite mask layer 114b.

The first and second interfacial layers 106a and 106b include silicon oxide, silicon oxynitride, a high-k material with a dielectric constant greater than 4, or a combination thereof. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, BST), lead zirconate titanate ($PbZr_xTi_{1-x}O_3$, PZT), and barium strontium titanate ($Ba_xSr_{1-x}TiO_3$, BST), wherein x is between 0 and 1. The first and second gate layers 108a and 108b can be dummy gates including polysilicon (or called crystalline silicon), amorphous silicon or a combination thereof. The first and second gate layers 108a and 108b can be doped or undoped.

The first and second lower mask layers 110a and 110b include a material having an etching selectivity different from that of the first and second upper mask layers 112a and 112b. In an embodiment, the first and second lower mask layers 110a and 110b include silicon nitride. The first and second upper mask layers 112a and 112b include silicon oxide.

Besides, the first stacked structure 120a further includes a first spacer 116a formed on the sidewall of the gate layer 108a, and the second stacked structure 120b further includes a second spacer 116b formed on the sidewall of the second gate layer 108b. The first and second spacers 116a and 116b include silicon oxide, silicon nitride or a combination thereof. Moreover, the first stacked structure 120a further includes source/drain regions (not shown) in the fin 102 beside the first gate layer 108a. The source/drain regions include doped regions, SiGe, SiC, SiP or a combination thereof Here, source/drain regions may not provide for the second stacked structure 120b, since the second stacked structure 120b is a structure for bumping rather than for logic/memory operation.

It is noted that the top surface of the first composite mask layer 114a is lower than the top surface of the second composite mask layer 114b. More specifically, the first and second lower mask layers 110a and 110b are substantially at the same plane, while the top surface of the first upper mask layer 112a is lower than the top surface of the second upper mask layer 112b. The possible mechanism is described below. In an embodiment, during the step of forming recesses (for source/drain regions) in the fin 102 beside the first stacked structure 120a, the etching gas may simultaneously etch away a portion of the first upper mask layer, so the first upper mask layer is deformed and reduced in height form its original state. Therefore, the first upper mask layer 112a is formed with a nipple shape and is thinner than the second upper mask layer 112b.

Still referring to FIG. 1A, a contact etch stop layer (CESL) 122 and a first dielectric layer 124 are sequentially formed on the substrate 100 covering the first and second stacked structures 120a and 120b. The CESL 122 includes silicon nitride, and the forming method thereof includes performing a chemical vapor deposition (CVD) process. The first dielectric layer 114 includes silicon oxide, and the forming method thereof includes performing a flowable CVD (FCVD) process. The flowable CVD process exhibits a superior gap-fill property, so as to completely fill the gaps between the stacked structures.

The embodiment of FIG. 1A in which each of the interfacial layers, the gate layers and the spacers is illustrated as a single-layer structure, but the present invention is not limited thereto. It is appreciated by people having ordinary skill in the art that each of the said components can be a composite layer or a multi-layer structure upon the process requirements.

Figure 1B:
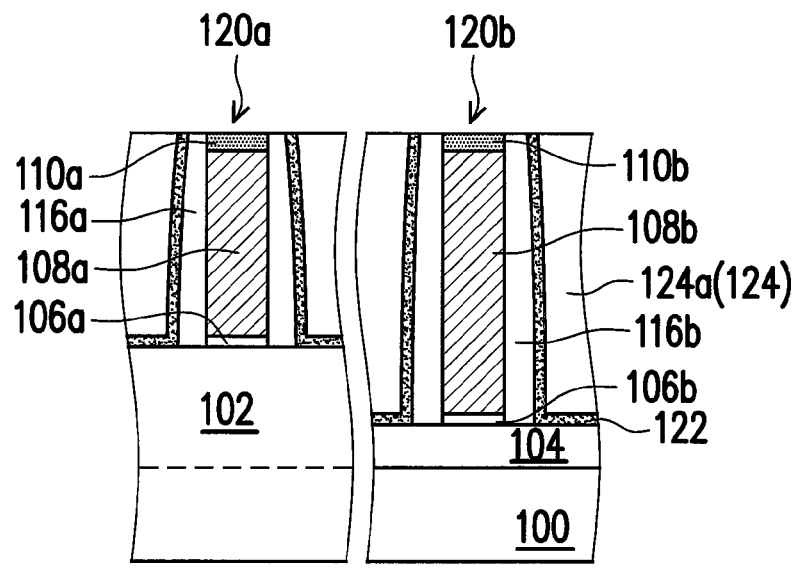

Referring to FIG. 1B, a portion of the first dielectric layer 124 and portions of the first and second stacked structures 120a and 120b are removed. In an embodiment, a portion of the CESL 122 and portions of the first and second spacers 116a and 116b are simultaneously removed during the removing step. The removing step includes performing a chemical mechanical polishing (CMP) process. Specifically, upper portions of the first dielectric layer 124, the CESL 122 and the first and second spacers 116a and 116b as well as the first and second upper mask layers 112a and 112b of the first and second stacked structures 120a and 120b are removed by using the first and second lower mask layers 110a and 110b as polishing stop layers. In such manner, the top surfaces of the first and second stacked structures 120a and 120b are substantially coplanar with the top surface of the remaining first dielectric layer 124a.

Thereafter, a first cleaning step is performed after the said CMP process. The first cleaning step can be referred to as a post-CMP cleaning step to remove residues left by the CMP. The first cleaning agent used in the first cleaning step includes a sulfuric acid-hydrogen peroxide mixture (SPM) and an ammonium hydrogen peroxide mixture (APM).

Figure 1C:
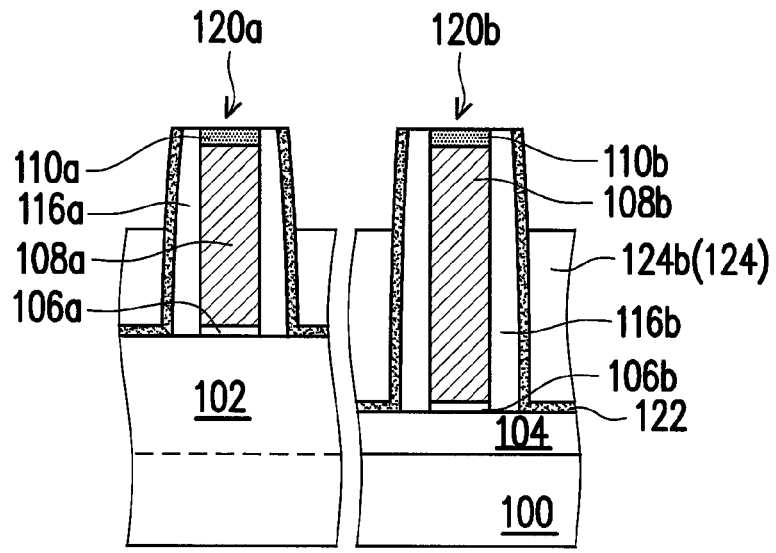

Referring to FIG. 1C, another portion of the first dielectric layer 124 is removed until the top surface of the remaining first dielectric layer 124b is lower than top surfaces of the first and second stacked structures 120a and 120b. The removing step includes performing an etching back (EB) process, and the etching depth can be controlled by a time mode. Upon the etching back process, the lower portions of the first and second stacked structures 120a and 120b are covered by the remaining first dielectric layer 124b, while the upper portions of the first and second stacked structures 120a and 120b are exposed.

Thereafter, a second cleaning step is performed after the said etching back (EB) process. The second cleaning step can be referred to as a post-EB cleaning step to remove residues left by the EB. The second cleaning agent used in the second cleaning step includes a sulfuric acid-hydrogen peroxide mixture (SPM) and an ammonium hydrogen peroxide mixture (APM).

Figure 1D:
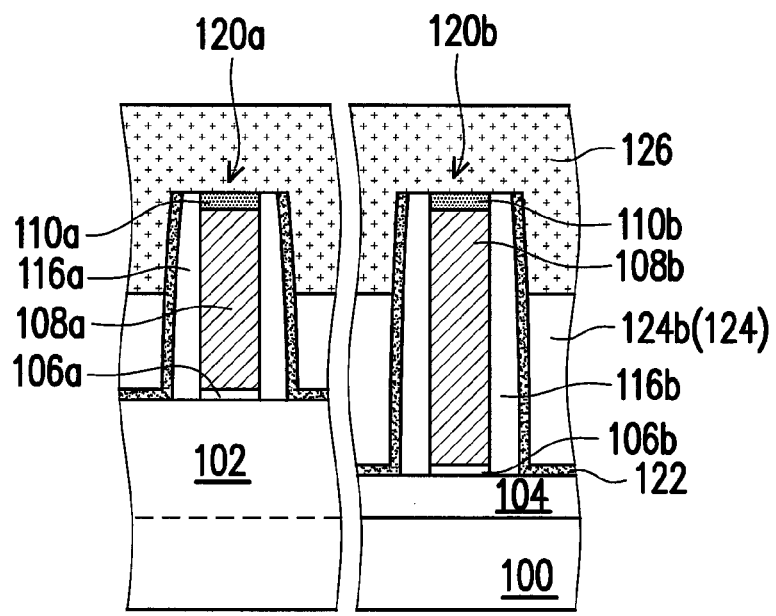

Referring to FIG. 1D, a second dielectric layer 126 is formed on the substrate 100 covering the first and second stacked structures 120a and 120b. The second dielectric layer 126 includes silicon oxide, and the forming method thereof includes performing a high density plasma CVD (HDP-CVD) process. In this embodiment, although the first and second dielectric layers 124 and 126 are made of silicon oxide, the second dielectric layer 126 is denser and harder than the first dielectric layer 124 since different forming methods are used. In another embodiment, the first and second dielectric layers 124 and 126 can be made of different materials upon the process requirements.

Figure 1E:
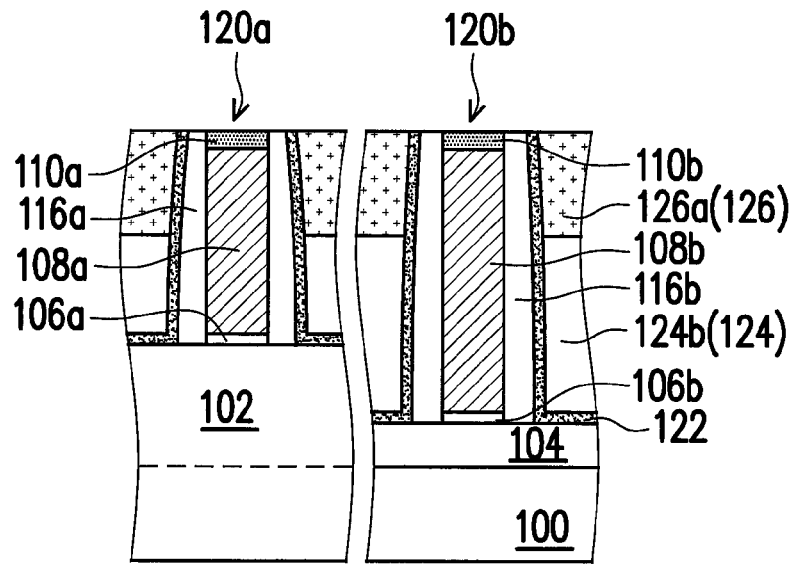

Referring to FIG. 1E, a portion of the second dielectric layer 126 is removed until the top surfaces of the first and second stacked structures 120a and 120b are exposed. The removing step includes performing a CMP process. Specifically, the upper portion of the second dielectric layer 126 is removed by using the first and second lower mask layers 110a and 110b as polishing stop layers. In such manner, the top surfaces of the first and second stacked structures 120a and 120b are substantially coplanar with the top surface of the remaining second dielectric layer 126a.

Thereafter, a third cleaning step is performed after the said CMP process. The third cleaning step can be referred to as a post-CMP cleaning step to remove residues left by the CMP. The third cleaning agent used in the third cleaning step includes a sulfuric acid-hydrogen peroxide mixture (SPM) and an ammonium hydrogen peroxide mixture (APM).

The said embodiment in which the first, second and third cleaning steps include the same cleaning agent is provided for illustration purposes, and is not construed as limiting the present invention. It is appreciated by people having ordinary skill in the art that the first, second and third cleaning steps can include different cleaning agents, as long as the residues left by CMP or EP can be effectively removed.

Besides, it is noted that a dual-layer dielectric structure is provided to replace the conventional single dielectric layer between stacked structures, and such disposition can effectively avoid the conventional dishing phenomenon. Specifically, the original stacked structures (as shown in FIG. 1A) are formed with different heights. In such case, voids may be generated in the single dielectric layer due to bad topography, and dishing may be observed because the single dielectric layer is not strong enough to resist the subsequent etching step. However, in the present invention, a dual-layer dielectric structure is provided between the adjacent stacked structures, in which the lower dielectric layer provides an excellent gap filling property, and the upper dielectric layer provides an excellent etching resistance property, so the conventional voids and dishing issues are not found.

Figure 1F:
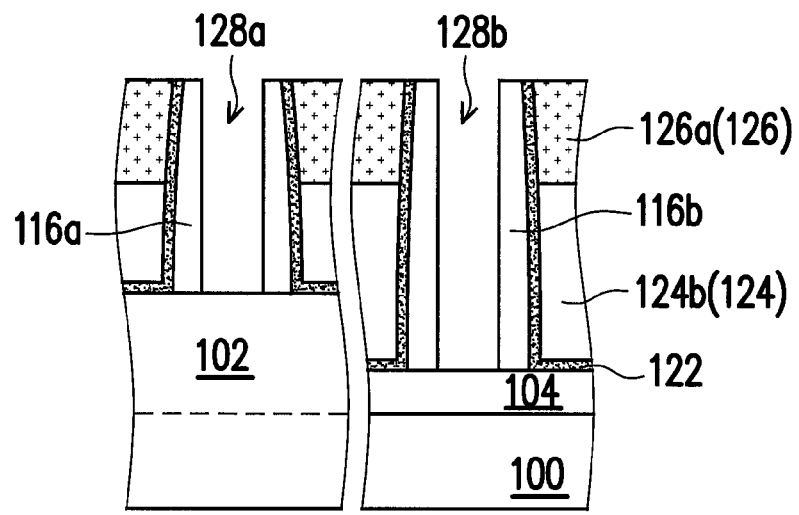

Referring to FIG. 1F, the first and second stacked structures 120a and 120b are removed to form first and second gate trenches 128a and 128b in the first and second dielectric layers 124 and 126. The first and second stacked structures 120a and 120b can be partially or completely removed upon the process requirements. The removing step includes performing an etching process.

In an embodiment, for a metal gate (high-k last) process, the first and second stacked structures 120a and 120b are completely removed, as shown in FIG. 1F. The following process steps (not shown) include forming a gate dielectric layer (e.g. silicon oxide), a high-k layer (e.g. $HfO_2$) and a barrier layer (e.g. TiN) on the surface of each of the first and second gate trenches 128a and 128b, and filling the first and second gate trenches 128a and 128b with metal gates. The metal gates include a work function metal layer and a low-resistivity metal layer.

In another embodiment, for a metal gate (high-k first) process, only the first and second lower mask layers 110a and 110b and the first and second gate layers 108a and 108b of the first and second stacked structures 120a and 120b are removed. The following process step (not shown) includes filling the first and second gate trenches 128a and 128b with metal gates. The metal gates 124a and 124b includes a work function metal layer and a low-resistivity metal layer. The metal gates include a work function metal layer and a low-resistivity metal layer.

In summary, the present invention provides a method of forming a semiconductor structure, by which an interlayer dielectric (ILD) layer between stacked structures is provided with a dual-layer configuration, and the upper dielectric layer is harder and denser than the lower dielectric layer. Accordingly, formation of dishing can be effectively avoided during the step of removing dummy gates and thereby the conventional issue of metal residues in the dishing can be settled. Besides, multiple cleaning steps are performed at appropriate stages, so as to effectively remove polymer residues and therefore improve the performance of the device. In addition, it is easy and simple to integrate the method of the invention into the existing CMOS process, thereby achieving competitive advantages over competitors.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   providing a substrate having multiple fins, wherein an insulating layer is formed to fill a lower portion of a gap between two adjacent fins;
   forming at least one first stacked structure and at least one second stacked structure on the substrate, wherein the first stacked structure is disposed on one fin and the second stacked structure is disposed on one insulation layer;
   forming a first dielectric layer on the substrate covering the first and second stacked structures;
   removing a portion of the first dielectric layer and portions of the first and second stacked structures;
   removing another portion of the first dielectric layer until a top surface of the remaining first dielectric layer is lower than top surfaces of the first and second stacked structures;
   forming a second dielectric layer on the substrate covering the first and second stacked structures; and
   removing a portion of the second dielectric layer until the top surfaces of the first and second stacked structures are exposed.

2. The method of claim 1, wherein the step of removing the portion of the first dielectric layer and the portions of the first and second stacked structures comprises performing a chemical mechanical polishing (CMP) process.

3. The method of claim 1, wherein the step of removing the another portion of the first dielectric layer comprises performing an etching back process.

4. The method of claim 1, wherein the step of removing the portion of the second dielectric layer comprises performing a chemical mechanical polishing (CMP) process.

5. The method of claim 1, wherein the first stacked structure comprises, from bottom to top, a first interfacial layer, a first gate layer and a first composite mask layer, and the second stacked structure comprises, from bottom to top, a second interfacial layer, a second gate layer and a second composite mask layer.

6. The method of claim 5, wherein a top surface of the first composite mask layer is lower than a top surface of the second composite mask layer.

7. The method of claim 5, wherein the first composite mask layer comprises a first lower mask layer and a first upper mask layer, and the second composite mask layer comprises a second lower mask layer and a second upper mask layer.

8. The method of claim 7, wherein the first and second upper mask layers are removed during the step of removing the portions of the first and second stacked structures.

9. The method of claim 7, wherein each of the first lower mask layer and the second lower mask layer comprises silicon nitride, and each of the first upper mask layer and the second upper mask layer comprises silicon oxide.

10. The method of claim 1, further comprising forming a contact etch stop layer (CESL) after the step of forming the first and second stacked structures and before the step of forming the first dielectric layer.

11. The method of claim 1, further comprising performing a first cleaning step after the step of removing the portion of the first dielectric layer and the portions of the first and second stacked structures and before the step of removing the another portion of the first dielectric layer.

12. The method of claim 11, wherein a first cleaning agent used in the first cleaning step comprises a sulfuric acid-hydrogen peroxide mixture (SPM) and an ammonium hydrogen peroxide mixture (APM).

13. The method of claim 1, further comprising performing a second cleaning step after the step of removing the another portion of the first dielectric layer and before the step of forming the second dielectric layer.

14. The method of claim 13, wherein a second cleaning agent used in the second cleaning step comprises a sulfuric acid-hydrogen peroxide mixture (SPM) and an ammonium hydrogen peroxide mixture (APM).

15. The method of claim 1, further comprising performing a third cleaning step after the step of removing the portion of the second dielectric layer.

16. The method of claim 15, wherein a third cleaning agent used in the third cleaning step comprises a sulfuric acid-hydrogen peroxide mixture (SPM) and an ammonium hydrogen peroxide mixture (APM).

17. The method of claim 1, wherein the second dielectric layer is denser and harder than the first dielectric layer.

18. The method of claim 1, wherein the step of forming the first dielectric layer comprises performing a flowable CVD (FCVD) process.

19. The method of claim 1, wherein the step of forming the second dielectric layer comprises performing a high density plasma CVD (HDP-CVD) process.

20. The method of claim 1, further comprising removing the first and second stacked structures to form gate trenches in the first and second dielectric layers.

* * * * *